United States Patent
Wurzinger et al.

(10) Patent No.: US 9,128,136 B2
(45) Date of Patent: Sep. 8, 2015

(54) APPARATUS AND METHOD FOR DETERMINING THE SENSITIVITY OF A CAPACITIVE SENSING DEVICE

(71) Applicant: Infineon Technologies AG, Neubiberg (DE)

(72) Inventors: Christoph Bernhard Wurzinger, Weiz (AT); Andreas Wiesbauer, Poertschach (AT)

(73) Assignee: Infineon Technologies AG, Neubiberg (DE)

( * ) Notice: Subject to any disclaimer, the term of this patent is extended or adjusted under 35 U.S.C. 154(b) by 267 days.

(21) Appl. No.: 13/836,579

(22) Filed: Mar. 15, 2013

(65) Prior Publication Data

US 2014/0266263 A1 Sep. 18, 2014

(51) Int. Cl.
*G01R 27/26* (2006.01)

(52) U.S. Cl.
CPC .................................. *G01R 27/2605* (2013.01)

(58) Field of Classification Search
CPC ................ G01R 27/2605; G01D 5/24–5/2417
USPC ............................ 324/658–690; 345/173–178
See application file for complete search history.

(56) References Cited

U.S. PATENT DOCUMENTS

| 2006/0005603 | A1* | 1/2006 | Chau et al. ..................... 73/1.38 |
| 2008/0061802 | A1 | 3/2008 | Alimi |
| 2008/0075306 | A1 | 3/2008 | Poulsen et al. |
| 2011/0142261 | A1* | 6/2011 | Josefsson ...................... 381/107 |
| 2012/0087205 | A1* | 4/2012 | Takagi et al. ................... 367/13 |
| 2012/0313767 | A1 | 12/2012 | Sitarski |
| 2013/0044898 | A1* | 2/2013 | Schultz et al. ................ 381/111 |

FOREIGN PATENT DOCUMENTS

| KR | 101209302 B1 | 12/2012 |
| KR | 20130021313 A | 3/2013 |

* cited by examiner

*Primary Examiner* — Patrick Assouad
*Assistant Examiner* — Demetrius Pretlow
(74) *Attorney, Agent, or Firm* — Eschweiler & Associates, LLC

(57) ABSTRACT

Embodiments relate to an apparatus for determining a sensitivity of a capacitive sensing device having a sensor capacitor with a variable capacitance. The apparatus includes a measurement module and a processor. The measurement module is configured to determine, in response to a first electrical input signal to the sensor capacitor, a first quantity indicative of a first capacitance of the sensor capacitor and to determine, in response to a second electrical input signal to the sensor capacitor, a second quantity indicative of a second capacitance of the sensor capacitor. The processor is configured to determine the sensitivity of the sensing device based on the determined first and second quantity.

24 Claims, 9 Drawing Sheets

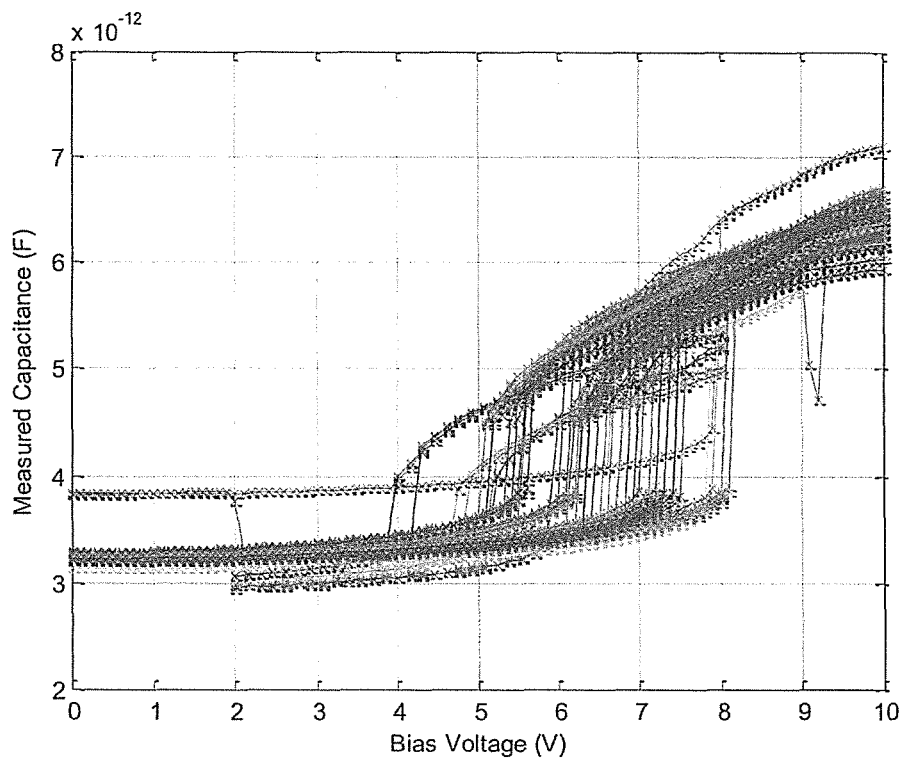
Fig. 5a
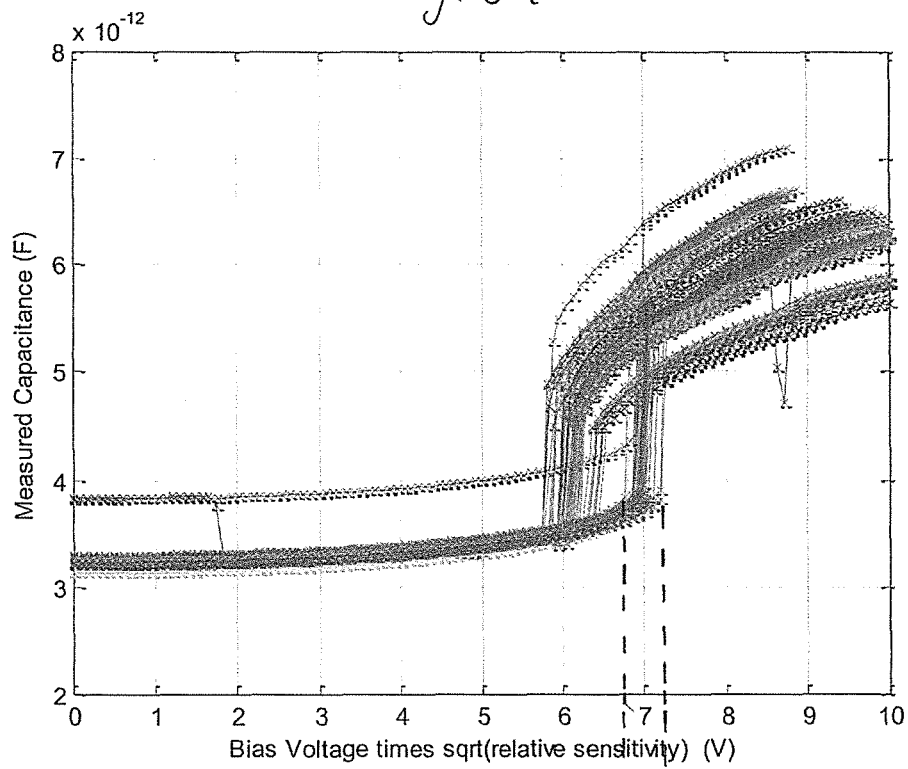
Fig. 5b    6.765V  7.205V

APPARATUS AND METHOD FOR DETERMINING THE SENSITIVITY OF A CAPACITIVE SENSING DEVICE

FIELD

Embodiments relate to apparatuses and methods for determining the sensitivity of capacitive sensing devices and, more particularly, to apparatuses and methods for determining the sensitivity of capacitive electromechanical sensing devices having variable sensor capacitances, such as silicon (condenser) microphones and comparable pressure sensors.

BACKGROUND

In transducers of condenser microphones, also referred to as capacitor microphones or electrostatic microphones, or other electromechanical pressure sensing devices, a membrane or diaphragm may act as one plate of a sensor capacitor. Pressure changes lead to changes in the distance between the plates. For condenser microphones there are two types, depending on the method of extracting the audio signal from the transducer: DC-biased microphones, and Radio Frequency (RF) or high frequency (HF) condenser microphones. With a DC-biased microphone, the capacitor plates may be biased with a fixed electrical charge. The voltage maintained across the capacitor plates changes with the vibrations in the air. The sensor capacitance of the plates is inversely proportional to the distance between them for a parallel-plate capacitor. Within a time-frame of the sensor capacitance change the charge is practically constant and the voltage across the capacitor changes instantaneously to reflect the change in capacitance. The voltage across the capacitor varies above and below the bias voltage.

Subject to manufacturing tolerances, silicon (condenser) microphones and comparable pressure sensors, such as Micro-Electro-Mechanical Systems (MEMS), typically experience variances in the capacitive sensor's sensitivity, which are generally undesired and may be compensated by means of proper measures, such as appropriate amplifier settings and/or variation of the bias voltage, which may be applied between the diaphragm and a back-plate structure forming the sensor capacitor. For such compensation it is necessary to determine the sensor's sensitivity during manufacturing and/or in the field, for example, at power-on, periodically or continuously in the background.

For example, the sensitivity of microphones or pressure sensors may be calibrated by applying a reference signal, such as a reference pressure. However, this concept is relatively cumbersome with respect to time and/or measurement equipment. Hence, it is typically avoided for microphones.

A variation of sensitivity also reflects in a course or trend of the sensor capacitance versus the bias voltage. An electrostatic force associated with the bias voltage is nonlinear due to its inverse square relationship with the air gap thickness between the capacitor electrodes. This gives rise to a phenomenon known as 'pull-in' or collapse that reduces the dynamic range of the diaphragm displacement. If the bias voltage exceeds this pull-in or collapse limit, the diaphragm will collapse, i.e. stick to the back plate. Conventionally, the pull-in or collapse voltage has been used as the key figure for sensitivity. Thereby the collapse voltage denotes the bias voltage at which the sensor capacity increases rapidly.

The pull-in voltage may be determined by recording a measurement series of capacity values versus corresponding bias voltages. Naturally, the accuracy of pull-in voltage determination is dependent on the distance of adjacent measurement points. In practice, a high accuracy requires a relatively high amount of measurement points and a correspondingly long measurement/calibration time, as the range of where to find the pull-in voltage may be relatively large due to manufacturing tolerances.

A further conventional method to determine the pull-in voltage is to apply a ramp-like bias voltage to a series circuit of a sensor and a resistor. As long as the bias voltage is lower than the pull-in voltage the current through the resistor is relatively constant. However, as soon as the bias voltage exceeds the sensor's pull-in voltage its diaphragm collapses. The related rapid increase of the sensor's capacitance yields a current impulse which may be evaluated directly or in form of a voltage across the resistor. This concept has the disadvantage that mechanical time constants (e.g. mass of the diaphragm, spring constant, mechanical and/or acoustic attenuation, volume of the housing, etc.) and electrical time constants (e.g., increase of the bias voltage, sensor capacity, electrical resistance, etc.) influence the measurement and, hence, hamper an exact determination of the pull-in voltage.

Hence, it is desirable to provide an improved concept for determining the sensitivity of capacitive sensors, such as condenser microphones and comparable pressure sensors.

SUMMARY

According to one aspect, embodiments provide an apparatus for determining a sensitivity of a capacitive sensing device having a sensor capacitor with a variable capacitance. The apparatus comprises a measurement module which is configured to determine, in response to a first electrical input signal to the sensor capacitor, a first quantity indicative of a first capacitance of the sensor capacitor, and to determine, in response to a second electrical input signal to the sensor capacitor, a second quantity indicative of a second capacitance of the sensor capacitor. The apparatus further comprises a processor which is configured to determine the sensitivity of the sensing device based on the determined first and second quantity.

In some embodiments, the capacitive sensing device may comprise a sensor capacitor which is formed by a diaphragm and a back plate structure of the sensing device. Thereby an electrical input signal may be or depend on a bias voltage across the sensor capacitor, for example. Hence, according to a further aspect embodiments provide an apparatus for determining a sensitivity of a capacitive sensing device having a sensor capacitor with a variable capacitance, wherein the sensor capacitor is formed by a diaphragm and a back plate. The apparatus comprises a measurement circuit which is configured to determine, in response to a first bias voltage applied to the sensor capacitor, a first quantity indicative of a first sensor capacitance between the diaphragm and the back plate, and to determine, in response to a second bias voltage applied to the sensor capacitor, a second quantity indicative of a second sensor capacitance between the diaphragm and the back plate. Further, the apparatus comprises a processor configured to determine the sensitivity of the sensing device based on a difference between the first and the second sensor capacitance.

According to yet a further aspect, embodiments provide a method for determining a sensitivity of a capacitive sensing device having a sensor capacitor with a variable capacitance. The method comprises a step of determining, in response to a first electrical input signal to the sensor capacitor, a first quantity indicative of a first capacitance of the sensor capacitor. The method further comprises a step of determining, in response to a second electrical input signal to the sensor capacitor, a second quantity indicative of a second capacitance of the sensor capacitor. Based on the determined first and second quantity (or a difference thereof) the sensitivity of the sensing device may be determined in a further step.

Some embodiments comprise a digital control circuit installed within an apparatus for performing the at least some steps of the method. Such a digital control circuit, e.g. a Digital Signal Processor (DSP), an Application-Specific Integrated Circuit (ASIC), or general purpose computer, needs to be programmed accordingly. Hence, yet further embodiments also provide a computer program having a program code for performing embodiments of the method, when the computer program is executed on a programmable hardware device.

BRIEF DESCRIPTION OF THE DRAWINGS

Some embodiments of apparatuses and/or methods will be described in the following by way of example only, and with reference to the accompanying figures, in which

FIG. 5a illustrates sensor capacitance versus bias voltage for various silicon microphones;

FIG. 5b illustrates sensor capacitance versus bias voltage for the various silicon microphones of FIG. 5a scaled with the square root of the respective relative sensitivity;

DETAILED DESCRIPTION

Figure 1:
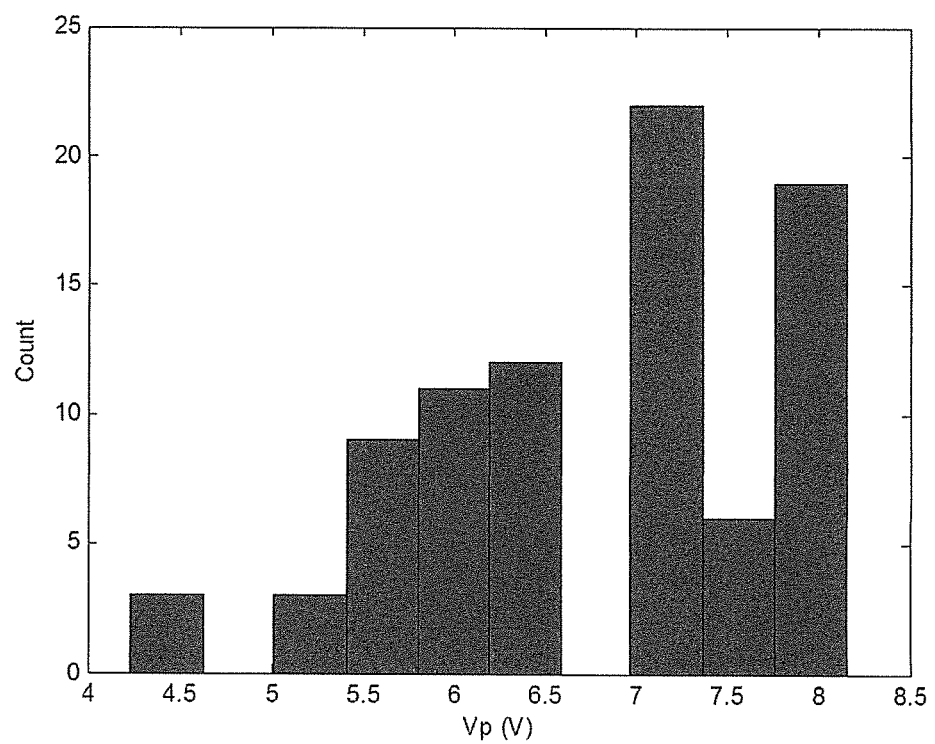
FIG. 1 depicts a histogram illustrating the manufacturing tolerances of MEMS microphones with respect to sensor sensitivity.

Various example embodiments will now be described more fully with reference to the accompanying drawings in which some example embodiments are illustrated. In the figures, the thicknesses of lines, layers and/or regions may be exaggerated for clarity.

Accordingly, while example embodiments are capable of various modifications and alternative forms, embodiments thereof are shown by way of example in the figures and will herein be described in detail. It should be understood, however, that there is no intent to limit example embodiments to the particular forms disclosed, but on the contrary, example embodiments are to cover all modifications, equivalents, and alternatives falling within the scope of embodiments. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Capacitive sensing devices, such as MEMS transducers, may be supplied with a DC bias voltage between a diaphragm and a back plate structure during normal operation. The capacitive sensing device's sensitivity may be reflected by the course of the sensor capacitance versus bias voltage. A characteristic point defining the sensor's sensitivity may be the so-called pull-in voltage (Vp) or collapse voltage. This characteristic voltage denotes the bias voltage at which the sensor capacitance rapidly increases. The pull-in voltage is caused by an attractive force between the diaphragm and the back plate structure when a constant bias voltage is applied during its operation. Its value is mainly determined by the spring restoring force of the diaphragm.

A problem in producing MEMS transducers with high yield is that the compliance or tension of the MEMS microphone diaphragm varies according to a number of manufacturing parameters that are difficult to accurately control. Absolute values of physical or mechanical parameters of silicon wafers, such as, for example, mechanical stiffness, electric resistance, transistor conductance, etc., may easily vary by ±20% or more. Other physical parameters of MEMS capacitive sensors may also vary, for example, diaphragm area, air gap height, i.e. the distance between the diaphragm and the back plate, etc. The air gap height in MEMS transducers may typically be 5 to 10 µm or smaller. The small dimensions of MEMS microphones impose severe limitations on how a DC bias voltage can be adjusted to compensate for a non-nominal acoustic sensitivity. Adjusting the DC bias voltage to a high value may cause the collapse threshold to move to an acceptable low value.

FIG. 1 exemplarily depicts a histogram 100 illustrating an example of manufacturing tolerances with respect to sensor sensitivity of MEMS transducers. It can be seen from FIG. 1 that the pull-in voltage (Vp) may vary from roughly 4.5 V to roughly 8 V due to manufacturing tolerances for a specific type of MEMS silicon condenser microphone. As has been explained in the introductory portion of this specification, there are various conventional methods or concepts for determining a microphone's or sensor's pull-in voltage and, hence, its sensitivity.

Embodiments, however, propose a novel concept for determining the sensitivity of a capacitive sensor or transducer device, such as a condenser microphone or a pressure sensor, which does not require finding the sensor's individual pull-in voltage value. Instead, embodiments allow determining the sensor's or transducer's sensitivity by performing two capacitance measurements at two distinct electrical input signals applied to the sensor. Thereby the two electrical input signals may be electrical signals defining a point of operation of the sensor or transducer, such a (bias-) voltages, electrical currents and/or electrical charges. In particular, the electrical input signals may be DC-signals according to embodiments. Based on a difference of the two capacitance measurements, the sensitivity of the sensor or transducer may be determined.

Hence, in embodiments, a cumbersome determination of the pull-in voltage is not required. In comparison to conventional concepts for determining the sensor's sensitivity embodiments, at least some of the embodiments allow a reduced measurement or calibration time. Furthermore, parasitic capacities in a measurement set up do not negatively influence the result because of the establishment of the sensor capacitance difference or a quantity indicative thereof.

Figure 2A:
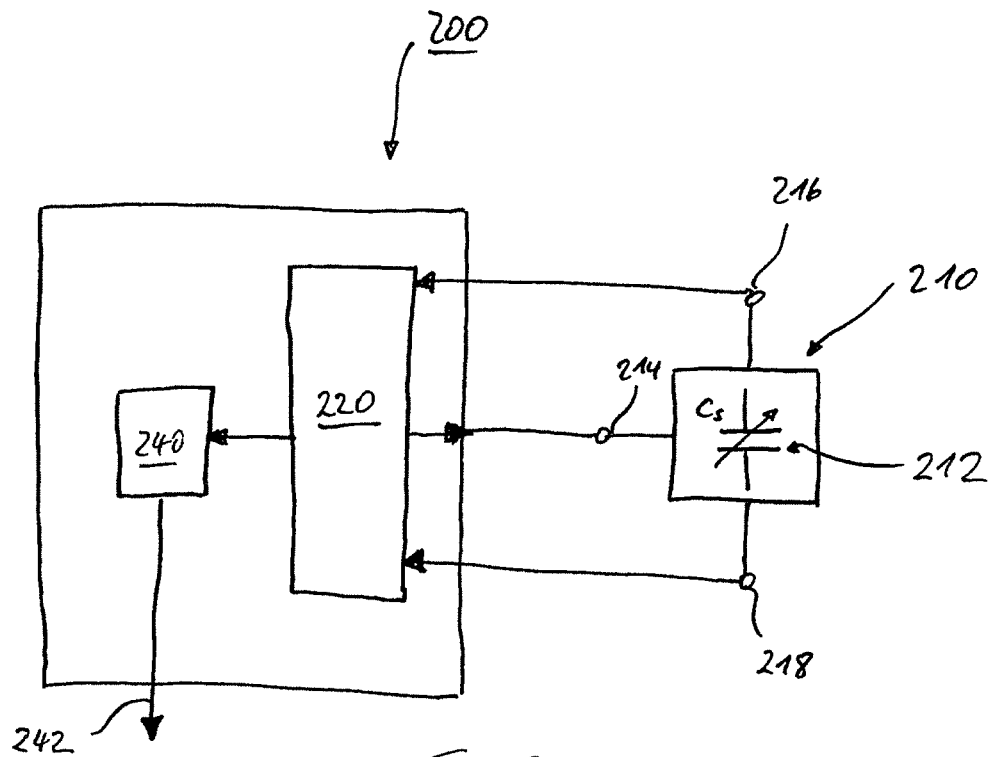
FIG. 2a illustrates an apparatus for determining a sensitivity of a capacitive sensing device, according to an embodiment.

Turning now to FIG. 2a, an apparatus 200 for determining a sensitivity of a capacitive sensing device 210 having a sensor capacitor 212 with a variable capacitance Cs is schematically illustrated.

The apparatus 200 comprises a measurement module 220, which is configured or operable to determine a first measurement quantity indicative of a first capacitance of the sensor capacitor 212. The measurement module 220 is configured to provide the first measurement quantity in response to a first electrical input signal, which may be provided to the sensing device 210 or its sensor capacitor 212 via terminal 214. The first measurement quantity is indicative of a first capacitance of the sensor capacitor 212. Thereby the first capacitance value may be dependent on the first electrical input signal. The first measurement quantity may be provided to the measurement module 220 via at least one of terminals 216, 218. Further, the measurement module 220 is configured to determine, in response to a second electrical input signal fed to the sensing device 212 or its sensor capacitor 212 via terminal 214, a second measurement quantity being indicative of a second capacitance of the sensor capacitor 212. The second capacitance value may be dependent on the second electrical input signal. The apparatus 200 further comprises a processor 240 which is coupled to measurement module 220 and configured to determine the sensing device's 210 sensitivity 242 based on the determined first and second measurement quantity or based on a difference thereof.

In general, the measurement quantities derived by the measurement module 220 may be electrical quantities such as complex impedances, electrical currents, electrical voltages, and/or electrical charges. Likewise, the first and second electrical input signals may be electrical signals for adjusting an operation point of the variable sensor capacitor 212. For example, in some embodiments the first and second operating signals may be or depend on first and second bias voltages. In other embodiments the first and second electrical input signals may be electrical charges, in particular electrical charges generated by (switched) electrical currents, applied to the sensor capacitor. No matter whether the operating signals are voltages or currents, the first and second electrical input signals result in first and second electrical charges being transported to the sensor capacitor 212 in order to adjust it to a first and second point of operation.

Figure 2B:
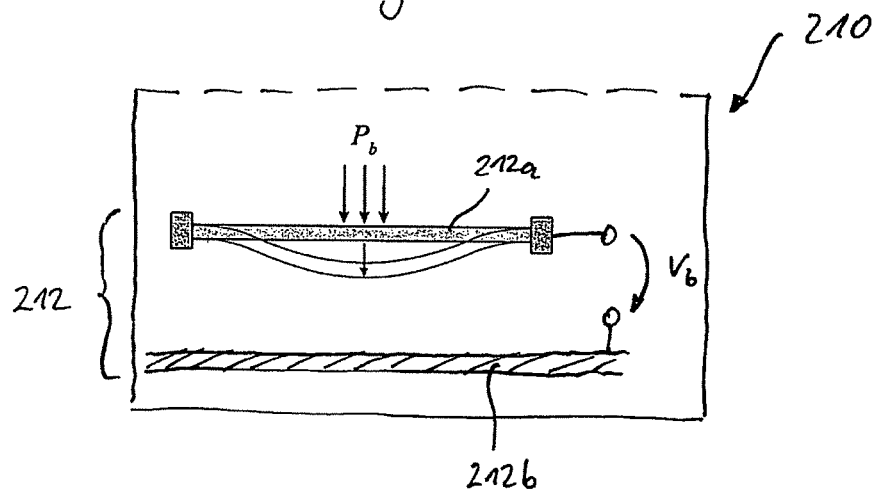
FIG. 2b illustrates an embodiment of a capacitive sensing device comprising a sensor capacitor which is formed by a diaphragm and a back plate structure.

Looking at FIG. 2b, it is illustrated that the first and second operational signals may lead to different deflections of a diaphragm 212a, respectively, and hence to different capacitances Cs of the sensor capacitor 212. In some embodiments the capacitive sensing device 210 may be an MEMS capacitive sensing device, such as, for example, an MEMS condenser microphone or an MEMS pressure sensor. In such cases, the sensor capacitor 212 may be formed by a membrane or diaphragm 212a and a back plate structure 212b of the capacitive sensing device 210, see FIG. 2b. Thereby the diaphragm 212a may be fabricated of various diaphragm materials including silicon nitride, polysilicon, aluminum, and polyamide, for example. An electrical input signal (or operating signal) in form of a DC bias voltage Vb may be applied to the sensor capacitor 212. In response to a pressure $P_b$ (e.g. a sonic pressure) onto the diaphragm 212a the diaphragm may deflect towards the back plate 212b. Due to the deflection of the diaphragm 212a, which acts as one electrode of the variable sensor capacitor 212, the sensor capacitance Cs varies or changes. The sensor capacitance Cs is inversely proportional to the distance between the diaphragm 212a and the back plate 212b. Hence, due to vibrations of air pressure a voltage across the sensor capacitor 212 varies above and below the bias voltage Vb.

With regard to FIG. 2b, some embodiments also provide an apparatus 200 for determining a sensitivity of a capacitive sensing device 210. The capacitive sensing device 201 is configured having a sensor capacitor 212 with a variable capacitance Cs, wherein the sensor capacitor 212 is formed by a diaphragm 212a and a back plate 212b. As shown in FIG. 2a, the apparatus 200 comprises a measurement circuit 220, which is configured to determine, a first measurement quantity indicative of a first sensor capacitance Cs1 between the diaphragm 212a and the back plate 212b, and to determine a second measurement quantity indicative of a second sensor capacitance Cs2 between the diaphragm 212a and the back plate 212b, shown in FIG. 2b. The first measurement quantity is determined in response to a first bias voltage Vb1 applied to the sensor capacitor 212. The second measurement quantity is determined in response to a second bias voltage Vb2 applied to the sensor capacitor 212. As shown above, the apparatus 200 comprises a processor 240 configured to determine the sensitivity of the sensing device 210 based on a difference ΔCs between the first and the second sensor capacitance Cs1, Cs2.

MEMS transducer devices may be manufactured by high volume or mass production. In such cases the measurement module 220 may comprise a so-called LCR meter for determining the first and the second quantity indicative of the first and second sensor capacitance Cs1, Cs2, respectively. Such LCR meters may typically be used for factory test and/or calibration during high volume production. An LCR meter (Inductance (L), Capacitance (C), and Resistance (R)) is a piece of electronic test equipment which may be used to measure the inductance, capacitance, and resistance of a component directly or indirectly. In short, LCR meters may also be used to determine the complex impedance of a Device-Under-Test (DUT). For that purpose the DUT may be subjected to an AC voltage source. The meter may measure the voltage across and the current through the DUT. From the ratio of these the meter can determine the magnitude of the impedance. The phase angle between the voltage and current may also be measured. In combination with the impedance, the processor 240 may calculate the equivalent capacitance Cs1, Cs2 of the DUT at the two distinct electrical input signals, respectively. From capacitances Cs1, Cs2 or a difference ΔCs thereof the sensor's sensitivity may be obtained, as will be explained in more detail below. Hence, in some embodiments, the measurement module 220 may comprise a LCR meter configured to determine, in response to the first electrical input signal (e.g. Vb1), a first impedance of the sensor capacitor and to determine, in response to the second electrical input signal (e.g. Vb2), a second impedance indicative of a second capacitance of the sensor capacitor 212, and to determine the sensor capacitance difference ΔCs based on the measured first and the second (complex) impedance.

Figure 3:
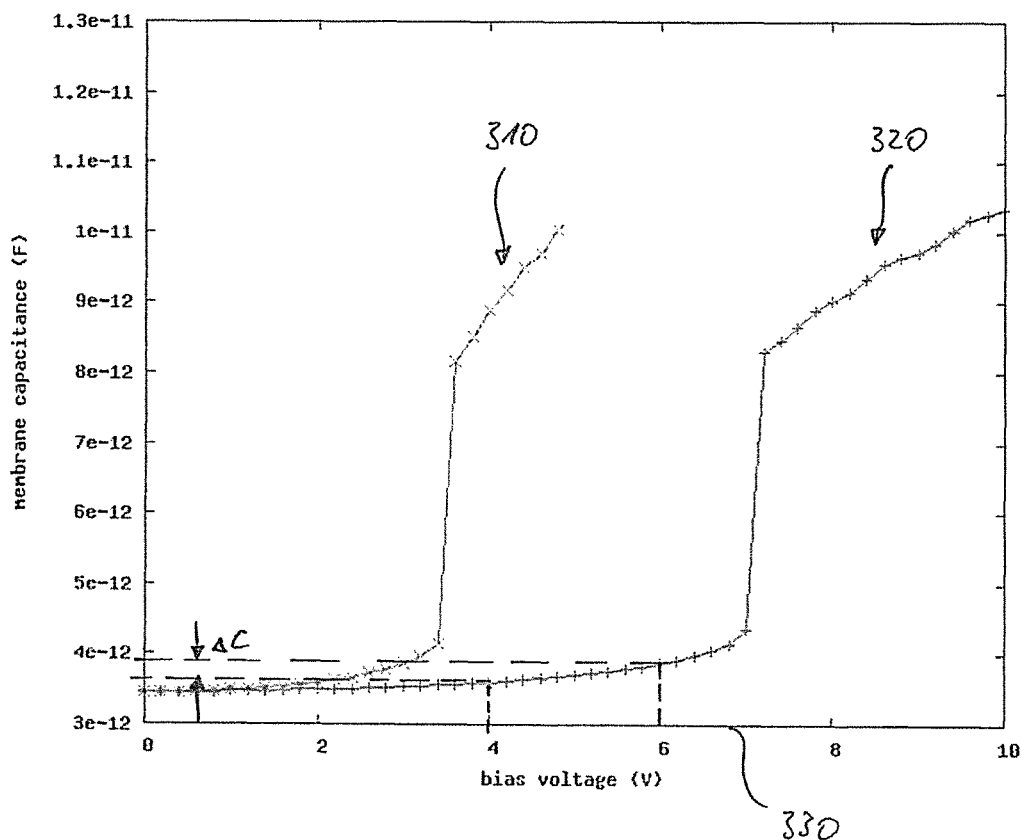
FIG. 3 illustrates two curves of sensor capacitance (membrane capacitance) versus bias voltage corresponding to two different sensor sensitivities.

FIG. 3 illustrates two curves 310, 320 showing courses of sensor capacitance Cs (membrane capacitance) versus bias voltage. The sensor capacitances Cs are provided for two different sensor sensitivities, which may be influenced by membrane or diaphragm manufacturing tolerances, for example. Curve 320 illustrates a course for a nominal sensitivity, whereas curve 310 illustrates a course for a sensitivity which is 4 times the nominal sensitivity. Following the trend of both curves 310 and 320 it can be seen that the sensitivity does not influence the principle trend of the curves, however, leads to a scaling of the curves with respect to the voltage axis 330. Thereby, the scaling along the voltage axis 330 is proportional to 1/sqrt (relative sensitivity). That is to say, in case the sensor's absolute sensitivity is 4 times a nominal sensitivity (that is, relative sensitivity=4), the voltage values get halved.

For embodiments it has been found that if the difference of the sensor capacitance is measured at two predefined but different bias voltages, the capacitance difference is dependent on the relative sensor sensitivity. This dependence or correspondence denotes a reversible function. Hence, determining the sensor capacitance differences at two different bias voltages as electrical input signals allows determining the sensor sensitivity based on the sensor capacitance. Hence, the processor 240, of FIG. 2, may be configured to determine, based on the first and the second measurement quantity or a difference thereof, the sensitivity based on an operation describing the sensing device's 210 sensitivity depending on the difference ΔCs between the first and the second sensor capacitance. In some embodiments, the operation may model a polynomial constructed from the difference ΔCs between the first and the second sensor capacitance Cs1, Cs2.

Figure 4:
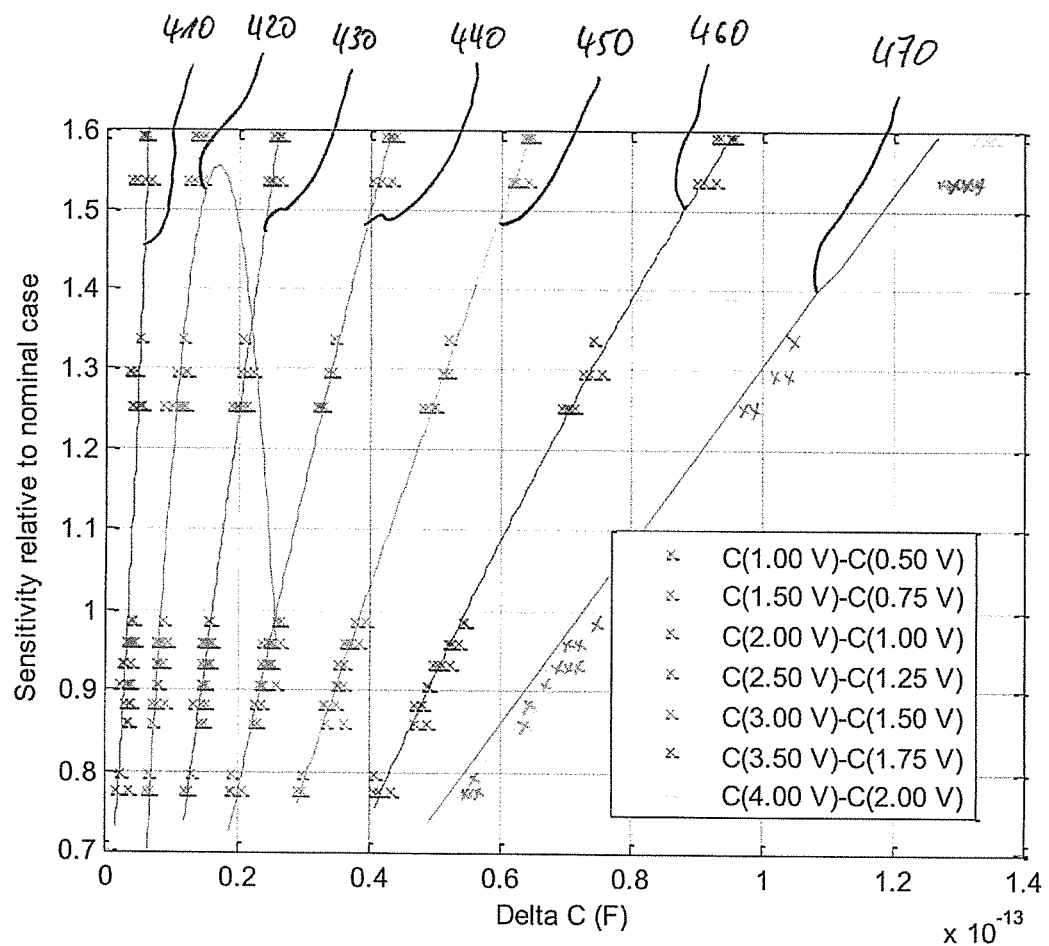
FIG. 4 illustrates a polynomial correspondence between sensor capacitance difference and relative sensitivity for a plurality of measurements and various pairs of bias voltages.

In this context FIG. 4 illustrates a correspondence between sensor capacitance difference ΔCs and relative sensitivity (related to a nominal sensitivity) for a plurality of measurements and various pairs of bias voltages Vb1, Vb2. Further, FIG. 4 illustrates a plurality of fitting polynomials 410 to 470 approximating a relationship between ΔCs and the relative sensor sensitivity. In the particular example of FIG. 4 all measurements for obtaining the fitting polynomials 410 to 470 were conducted with the same set of different MEMS sensor devices. However, the different measurement results approximated by polynomials 410 to 470, respectively, deviate from each other by a different choice of a difference between the first and second bias voltage Vb1, Vb2 across the sensor capacitor 212, respectively. In the diagram of FIG. 4, the different fitting polynomials 410 to 470 were approximated by measured sensor capacitance differences ΔCs due to different bias voltages Vb1, Vb2 applied to the variable sensor capacitor 212. Thereby the polynomial 410 has been obtained by determining the sensor capacitance differences ΔCs of different sensor samples. The sensor capacitance differences ΔCs have been obtained by applying a first bias voltage of 0.5 V and a second bias voltage of 1 V to the different sensor samples. Hence, the difference between the first and the second bias voltage is 0.5 V for polynomial 410. Likewise, the polynomial 420 has been obtained by determining the sensor capacitance differences ΔCs based on a bias voltage difference of 0.75 V for the various samples. The polynomial 430 has been obtained by determining the sensor capacitance differences ΔCs=Cs1−Cs2 of different sensor samples by applying a first bias voltage of 2.0 V and a second bias voltage of 1.0 V to the different sensor samples. Hence, the difference between the first and the second bias voltage is 1.0 V for polynomial 430. The polynomial 440 has been obtained by determining the sensor capacitance differences ΔCs based on a bias voltage difference of 1.25 V for the various samples. The polynomial 450 has been obtained by determining the sensor capacitance differences ICs=Cs1−Cs2 of different sensor samples by applying a first bias voltage of 3.0 V and a second bias voltage of 1.5 V to the different sensor samples. Hence, the difference between the first and the second bias voltage is 1.5 V for polynomial 430. The polynomial 460 has been obtained by determining the sensor capacitance differences ΔCs based on a bias voltage difference of 1.75 V for the various samples. The polynomial 470 describes the relative sensitivity versus ΔCs for a bias voltage difference of 2 V, as the first bias voltage in this case has been 4.0 V whereas the second bias voltage has been 2.0 V.

In embodiments the polynomials or curves 410 to 470 may be determined initially and stored in a memory device of the apparatus 200 or the processor 240 thereof. For example, the storage of the polynomials 410 to 470 may be done in the form of Look-Up Tables (LUTs). Thereby a LUT is an array that may replace runtime computation with a simpler array indexing operation. The savings in terms of processing time can be significant, since retrieving a value from memory is often faster than undergoing an 'expensive' computation or input/output operation. The tables may be pre-calculated and stored in static program storage, calculated (or "pre-fetched") as part of a program's initialization phase, or even stored in hardware in application-specific platforms. In this way, the (relative) sensitivity of the sensor device 210 under test corresponding to a measured or determined capacitance difference ΔC may be found by a convenient table look-up operation. Having determined the relative sensor sensitivity it is possible to calibrate the sensor device 210 to act comparable to a sensor having nominal sensitivity, for example.

In other words, the fitting polynomials 410 to 470 may be used to obtain the sensor's sensitivity based on a capacitance ΔCs difference determined at two different known bias voltages Vb1, Vb2. Hence, the processor 240 may be configured to determine the difference ΔCs between the first and the second capacitance (or measured quantities indicative thereof), in order to determine the sensing device's sensitivity based on the difference. Note that it is not necessary to know the two bias voltages Vb1, Vb2 in advance as long as they are different from each other and lower than the pull-in voltage of the sensor device 210. Further, the bias voltages Vb1, Vb2 should be as sufficiently apart from each other in order to determine the sensor capacitance difference accurately enough. In other words, the measurement module 220 may be configured to determine the first measurement quantity based on a first bias voltage Vb1 applied to the sensor capacitor 212 and to determine the second quantity based on a second, different, bias voltage Vb2 applied to the sensor capacitor 212. Further, the measurement module 220 may be configured to choose both the first and the second bias voltage Vb1, Vb2 to be smaller than the pull-in voltage or collapse voltage of the capacitive sensing device 210. Thereby, the pull-in voltage denotes a bias voltage at which the sensor capacitor, which may be formed by means of the diaphragm 212a, collapses. In particular embodiments, the measurement module 220 may be configured to choose the first and the second bias voltage Vb1, Vb2, such that a difference between the first and the second voltage is at least 0.5 V, as has been explained with reference to FIG. 4. Of course this value may deviate depending on the underlying technology of the capacitive sensor 210.

To illustrate their effectiveness, embodiments have been applied to a plurality of sensors 210 of different sensitivities for which detailed series of measurements of sensor capacitance versus bias voltage are available, see FIG. 5a. The different sensitivities of the measured sensor samples can be recognized from the spread of the respective pull-in voltages, which ranges from roughly 4 V to roughly 8 V for the depicted example.

The relative sensitivity which has been determined for the measurements of FIG. 5a has been used to scale the measurements along the voltage axis, see FIG. 5b. FIG. 5a illustrates the original measurements. As scaling takes place towards the nominal case, the respective original bias voltages have been multiplied with the square root of the determined relative sensitivity. By using the sensor capacitance difference between a first sensor capacitance at Vb1=1.75 V and Vb2=3.5 V, the respective relative sensitivity has been determined. FIG. 5b illustrates the result which has been obtained by an embodiment. Even if the pull-in voltage is not important for the sensor sensitivity determination according to embodiments, the pull-in voltage may be used to judge the quality of embodiments. FIG. 5b shows that the scaled pull-in voltages do not exactly correspond to the nominal pull-in voltage of 7 V. The relative deviation may be determined based on the correspondence Relative Sensitivity=(Nominal Pull-In Voltage/Actual Pull-In Voltage)$^2$, which results from the above discussion. In FIG. 5b the lowest scaled pull-in voltage is 6.765 V, whereas the highest scaled pull-in voltage is 7.205 V. This yields an error in the determined sensitivity in the range of—0.59 dB to 0.5 dB. For comparison, note that conventional microphones may have a deviation from nominal sensitivity in the range of 3 dB according to specifications. Note that the voltages around 6 V denote the so-called release voltage. The pull-in effect has a hysteresis and once the membrane collapsed to the backplate, it will stay there even for lower voltages, in this case in the range of 6V.

Embodiments are not limited to the determination of the sensor capacitance difference ΔCs based on different bias voltages Vb1, Vb2 as electrical input signals. Likewise, the capacitance difference ΔCs may also be determined based on two known and different electrical charges of the sensor capacitor 212. The predetermined electrical charges also lead to two distinct bias voltages between the electrodes 212a, 212b of the sensor capacitor 212 and to the corresponding sensor capacitance difference ΔCs. Depending on the underlying concept, i.e. different bias voltages or different electrical charges as electrical input signals to the capacitor 212, different polynomials may be required to determine the sensor's sensitivity based on other capacitance differences ΔCs.

Figure 6:
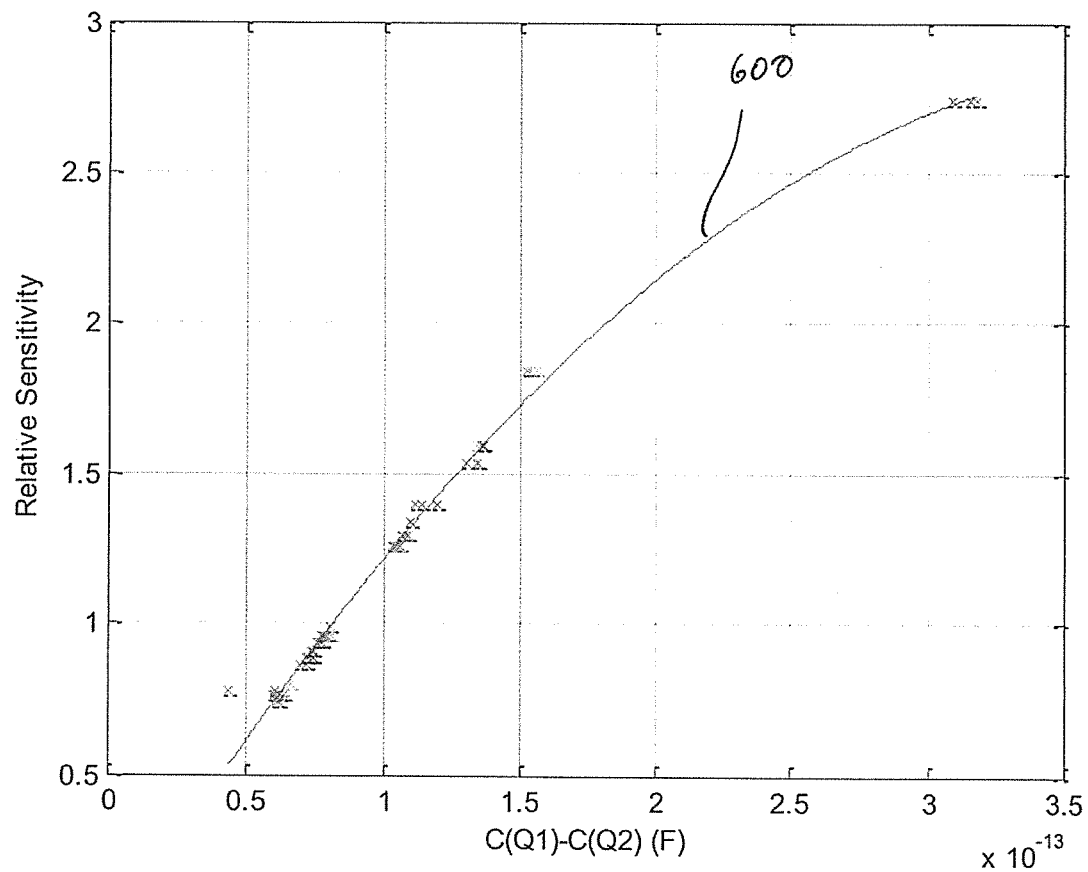
FIG. 6 shows the relative sensitivity versus sensor capacitance difference (with curve fitting polynomial) at two different charges.
Figure 7:
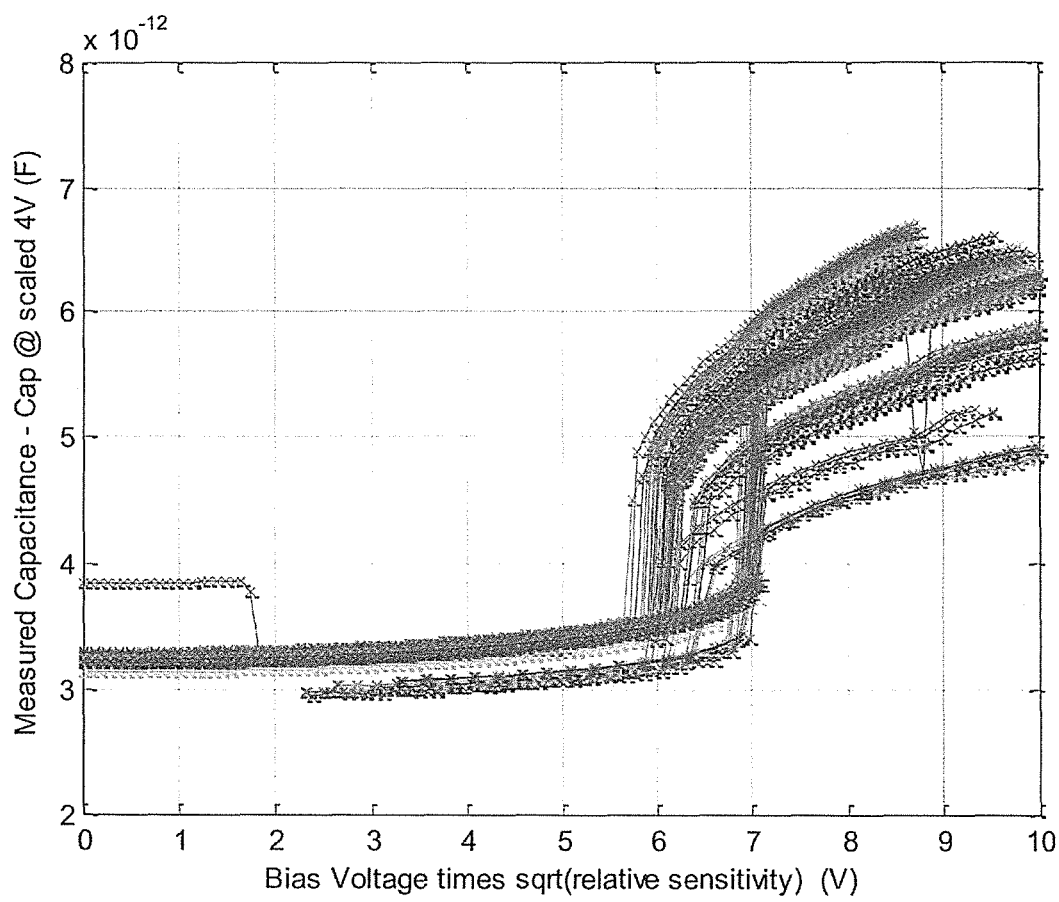
FIG. 7 illustrates sensor capacitance versus bias voltage for various silicon microphones scaled with the square root of the respective relative sensitivity based on a capacitance difference at two different charges.

An exemplary polynomial 600, which has been determined based on a measurement series employing different electrical charges applied to the sensor capacitor 212, is shown in FIG. 6. The resulting curve "sensor capacitance versus bias voltage" is illustrated in FIG. 7. Again, it can be seen that embodiments lead to only small deviations from the nominal pull-in voltage of 7 V. Again, the voltages around 6 V correspond to the respective release voltages.

In order to employ embodiments to measurements and/or calibrations of wafers during high volume production or for laboratory measurements, it may be sufficient to use LCR meters as measurement modules 220, following the above description. However, using embodiments in conjunction with integrated circuits (for example an ASIC) may not be as straightforward. For using embodiments together with ASICs there are two steps: First, the sensor sensitivity needs to be determined, for example, by measuring the capacitance difference at two distinct bias voltages or charges. Second, the sensor device 210 may be calibrated, for example based on the determined sensitivity, to correct any deviations from a nominal sensitivity. For example, in case of a relative sensitivity larger than 1, a further downstream amplification of the electrical signal variations caused by oscillations or vibrations of the diaphragm 212a may be decreased compared to the nominal case. In contrast, if the relative sensitivity is lower than 1, the downstream amplification of the resulting electrical signal variations may be increased instead.

Figure 8A:
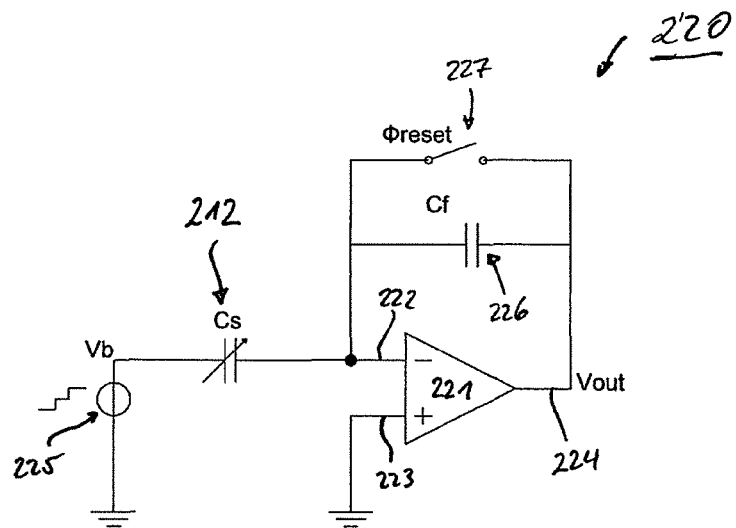
FIG. 8a-c show various exemplary embodiments of measurement modules for determining voltages as the first and second measurement quantities.

FIG. 8a illustrates a first embodiment of an electrical circuit which may be comprised by the measurement module 220 of apparatus 200. The embodiment of FIG. 8a allows determining the sensor capacitance difference ΔC indirectly based on a first bias voltage Vb1 as a first electrical input or control signal to the capacitor 212 and based on a second bias voltage Vb2 as a second electrical input or control signal to the sensor capacitor 212. If the bias voltage Vb is used as electrical input or control signal, the resulting electrical charge may be measured which has been necessary to cause the bias voltage Vb across the sensor capacitor 212.

In the exemplary embodiment of measurement module 220 illustrated in FIG. 8a, the measurement module 220 comprises an amplifier 221 having a first input terminal 222, a second input terminal 223, and an output terminal 224. A first terminal or electrode of the sensor capacitor 212 is coupled to a bias voltage source 225. A second terminal or electrode of the sensor capacitor 212 is coupled to the first input terminal 222 of the amplifier 221, which may be an operational amplifier. A feedback capacitor 226 is coupled between the amplifier's output terminal 224 and its first input terminal 222. Likewise, a switch 227 is coupled between the output terminal 224 and the amplifier's input terminal 222 for discharging or discharging the capacitors 212 and/or 226. According to the embodiment of FIG. 8a, the amplifier 221 may be an inverting amplifier and the amplifier's first input terminal 222 may be an inverting input terminal. The second input terminal 223, which may be non-inverting, may be coupled to electric ground. The exemplary circuit configuration of FIG. 8a leads to a virtual shortage between the two amplifier input terminals 222 and 223. Further, the first input terminal 222 is virtually also connected to electric ground.

The inverting amplifier 221 of FIG. 8a serves for converting the electrical charge of capacitor 212 into a corresponding output voltage Vout by means of the feedback capacitor 226. The functionality of the embodiment of FIG. 8a is as follows: Starting point is a fully-uncharged sensor capacitor 212 (i.e. Vb=0) and feedback capacity (i.e. Vout=0). Subsequently, a first known bias voltage Vb1 may be applied to an input electrode (left) of the sensor capacitor 212 coupled to the voltage source 225. This results in an electrical charge Q1 in the sensor capacitor 212 as well as in the feedback capacitor 226, leading to a first output voltage Vout1 at the amplifier's output terminal 224, with Vout1=−Q1/Cf. In a further measurement, a second known bias voltage Vb2, different from Vb1, may be used to cause a second electrical charge Q2 in both capacitors 212 and 226, leading to a second output voltage Vout2=−Q2/Cf at output node 224. In other words, the measurement module 220 may be configured to apply a first bias voltage Vb1 to an input port of the sensor capacitor 212 and to measure a resulting first output voltage Vout1 at the amplifier's output terminal 224, and to subsequently apply a second bias voltage Vb2 to the input port of the sensor capacitor 212 and to measure a resulting second output voltage Vout2 at the amplifier's output terminal 224, and to determine a sensor capacitance difference ΔCs based on the first and the second bias voltage Vb1, Vb2, and based on the first and the second output voltage Vout1, Vout2. In particular, the measurement module 220 or the processor 240 of FIG. 2 may be configured to determine the sensor capacitance difference ΔCs based on $$\Delta Cs = Q2/Vb2 - Q1/Vb1 \text{ or } \Delta C = Cf \times (Vout1/Vb1 - Vout2/Vb2),$$

wherein Cf denotes the capacitance of the feedback capacitor 226, Vout1 denotes the first output voltage at output node 224, Vb1 denotes the first bias voltage of bias voltage source 225, Vout2 denotes the second output voltage at output node 224, and Vb2 denotes the second bias voltage of voltage source 225. Further, the measurement module or the processor 240 may be configured to determine the sensing device's sensitivity based on the difference ΔCs, for example, by using a polynomial relationship between the sensitivity and the capacitance difference ΔCs.

In some embodiments the measurement module 220 may additionally or alternatively be configured to determine a first measurement quantity, e.g. a first output voltage Vout1 at output node 224, based on a first electrical charge applied to the sensor capacitor 212 and to determine the second measurement quantity, i.e. a second output voltage Vout2 at output node 224, based on a second, different electrical charge applied to the sensor capacitor 220. An example of suitable electrical circuitry for such an embodiment is illustrated in FIG. 8b.

Figure 8B:
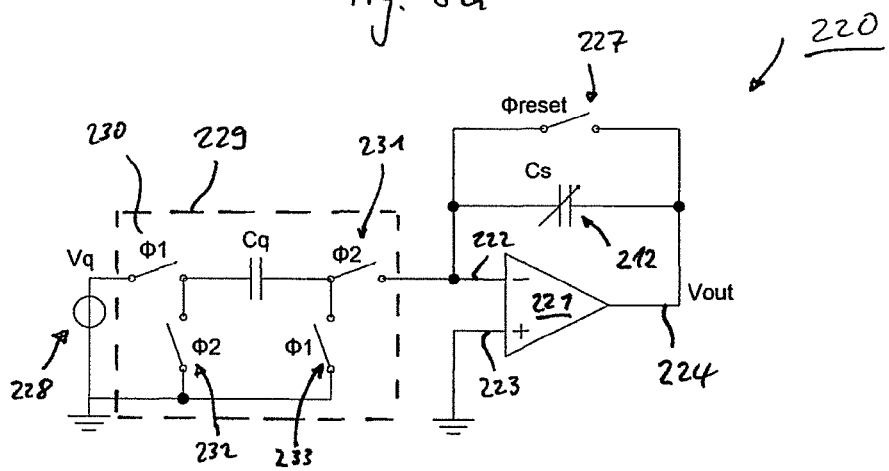

The embodiment of FIG. 8b differs from the embodiment of FIG. 8a in that the sensor capacitor 212 is coupled in between the amplifier's output terminal 224 and the amplifier's first input terminal 222 instead of the feedback capacitor of FIG. 8a. Further, a voltage source 228 is coupled to the amplifier's inverting input terminal 222 via a switched capacitor network 229 to apply a first and a second electrical charge to the sensor capacitor 212 in two subsequent clock cycles, respectively. The switched capacitor network 229 comprises a first switch 230 between the voltage source 228 and a transport capacitor Cq. A second switch 231 is coupled between the transport capacitor Cq and the first input terminal 222 of amplifier 221. A further switch 232 is coupled between the first (left) terminal of the transport capacitor Cq and ground potential, whereas a third switch 233 is coupled between the second (right) terminal of transport capacitor Cq and ground potential.

If the electrical charge in the sensor capacitor 212 is prescribed or predetermined, a voltage across the sensor capacitor 212 can be determined to draw conclusions on the corresponding variable sensor capacitance value Cs. The switched capacitor network 229 allows precisely transporting electrical charge packets. Starting from an uncharged sensor capacitor 212 a predefined electrical charge quantity Q=Vq×Cq may be transported from voltage source 228 to the sensor capacitor 212 within one clock cycle comprising both clock phases φ1 and φ2. During a clock phase φ1, the corresponding switches 230, 233 are closed (while switches 231, 232 are open), allowing charging transport capacitor Cq with the electrical charge Q. During second clock phase φ2, the corresponding switches 231, 232 are closed (while switches 230, 233 are open), thereby allowing to transport the electrical charge Q further from transport capacitor Cq to sensor capacitor 212, leading to a first output voltage Vout1 at node 224, with Vout=Q/Cs(1). The index 1 serves for differentiating from the sensor capacitance after the end of the second clock cycle. After the end of the second clock cycle (comprising φ1 and φ2) and a further charge package Q, a second output voltage Vout2=2Q/Cs(2) can be measured at output node 224.

Hence, the measurement module 220 of FIG. 8b may comprise an amplifier 221 having an input terminal 222 and an output terminal 224, wherein the sensor capacitor 212 is coupled between the output terminal 224 and the input terminal 222 of the amplifier 221, wherein the first electrical charge Q(1) is transported from the voltage source 228 via the transport capacitor Cq to the sensor capacitor 212 in a first clock cycle (comprising switch phases φ1 and φ2) of the switched capacitor network 229, leading to a first output voltage Vout1 at the output terminal 224 of the amplifier 221. The second electrical charge Q(2) is transported from the voltage source 228 via the transport capacitor Cq to the sensor capacitor 212 in a second clock cycle (comprising switch phases φ1 and φ2) of the switched capacitor network 229, leading to a second output voltage at the output terminal 224 of the amplifier 221. The measurement module 220 or the processor 240 may be configured to determine the sensor capacitance difference ΔCs based on a voltage value Vq of the voltage source 228 and the first and the second output voltage Vout1, Vout2. In particular, the processor 240 may be configured to determine the sensor capacitance difference ΔCs based on $$\Delta Cs = 2Q/Vout2 - Q/Vout1 = Cq \times (2Vq/Vout2 - Vq/Vout1),$$

wherein Cq denotes the capacitance of the transport capacitor, Vq denotes the voltage of the voltage source 228, Vout1 denotes the first output voltage at node 224, and Vout2 denotes the second output voltage at the node 224.

Figure 8C:
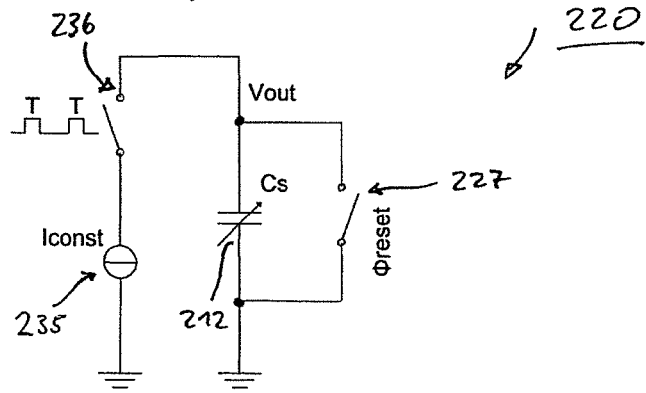

FIG. 8c illustrates a further embodiment of the measurement module 220 comprising a current source 235 coupled to the sensor capacitor 212 via a switch 236. In parallel to the sensor capacitor 212, there is arranged a further switch 227 for de- or uncharging or discharging the sensor capacitor 212. In this embodiment, the sensor capacitor 212 is charged, starting from an uncharged state, with a known constant current Iconst during a first defined time interval of duration T (during which switch 236 is closed). After the first time interval T, an output voltage Vout1 across the sensor capacitor 212 is Vout1=Q/Cs(1)=Iconst×T/Cs(1). After a further, second charging time interval of duration T, a second output voltage Vout2=2×Q/Cs(2) may be measured across the sensor capacitor 212. The switch 227 may not be closed in between the first and the second charging intervals.

In other words, the measurement module 220 of FIG. 8c may be configured to charge, during a first time interval, the sensor capacitor 212 with a constant current Iconst from the current source 235 to obtain a first voltage Vout1 across the electrodes of the sensor capacitor 212 and to further charge, during a subsequent second time interval, the sensor capacitor 212 with a constant current Iconst to obtain a second voltage Vout2 across the electrodes of the sensor capacitor 212. Thereby, the measurement module 220 or the processor 240 coupled thereto may be configured to determine the sensor capacitance difference ΔC based on a duration T of the two time intervals, the constant current Iconst and the first and the second voltage Vout1, Vout2. In particular, the measurement module 220 or the processor 240 may be configured to determine the sensor capacitance difference ΔCs based on $$\Delta Cs = 2Q/Vout2 - Q/Vout1 = T \times Iconst \times (2/Vout2 - 1/Vout1),$$

wherein T denotes a duration of the first and the second time interval, respectively, Iconst denotes the constant current, Vout1 denotes the first voltage (measurement quantity), and Vout denotes the second voltage (measurement quantity) across the electrodes of the sensor capacitor 212.

Figure 9:
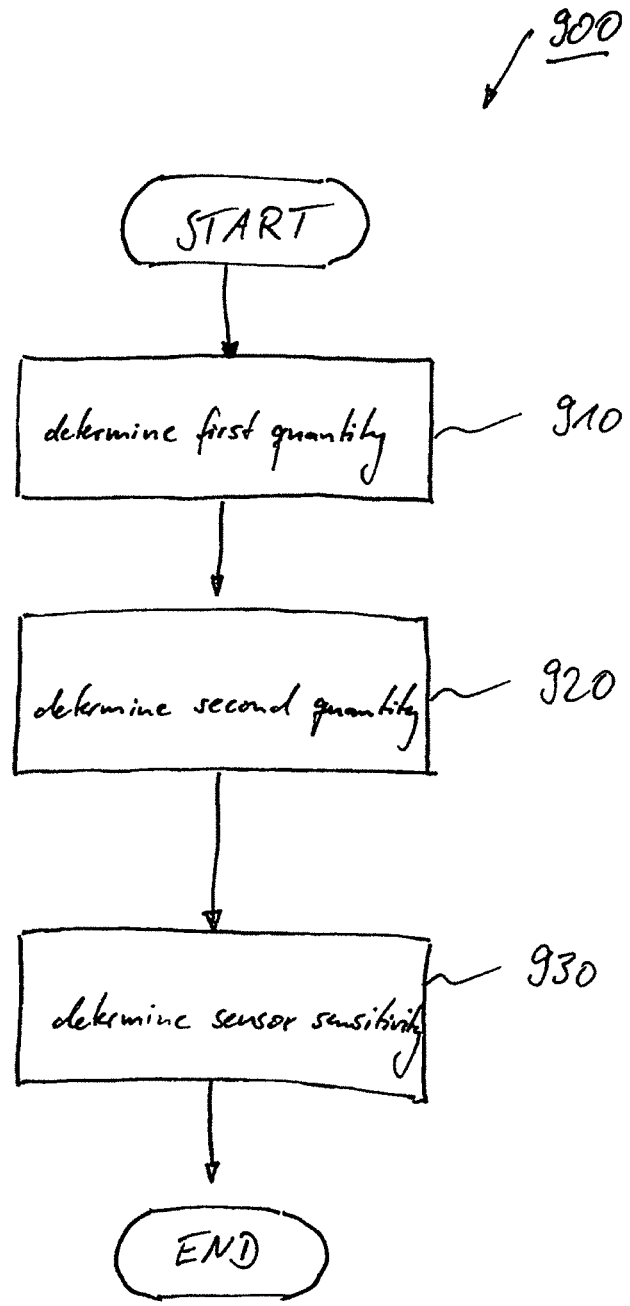
FIG. 9 illustrates a flow-chart of a method for determining a sensitivity of a capacitive sensing device, according to an embodiment.

It will be apparent to the skilled person that the apparatus 200 illustrated in FIG. 2 and the embodiments of the measurement modules described above may be configured to perform a corresponding method for determining the sensitivity of the capacitive sensing device 210. A flowchart 900 of an exemplary embodiment of the method is illustrated in FIG. 9.

The method 900 has a first step 910 of determining a first measurement quantity indicative of a first sensor capacitance of the sensor capacitor 212 in response to a first electrical input signal to the sensor capacitor 212. As has been explained before, the first measurement quantity may be a voltage, for example. However, other electrical quantities, such as complex impedances, electrical currents, etc., are also possible. Method 900 further includes a second step 920 of determining, in response to a second electrical input signal to the sensor capacitor 212, a second measurement quantity indicative of a second sensor capacitance of the sensor capacitor 212. In a further step 930, the sensitivity of the sensing device 210 may be determined based on the determined first and second measurement quantity. In some embodiments, step 930 may comprise determining the difference between the first and the second sensor capacitance based on the first and second measurement quantity (e.g. Vout1, Vout2) in order to determine the sensing device's pressure sensitivity based on the capacitance difference ΔCs. As has been described before, this may be performed by an operation modeling the sensing device's sensitivity in dependence on the sensor capacitance difference ΔCs. This operation may, for example, be a table look-up modeling a polynomial constructed from the difference between the first and the second sensor capacitance.

To summarize, embodiments propose a novel concept for determining the sensitivity of a capacitive sensor or transducer, such as a condenser microphone or a pressure sensor. Embodiments allow determining the sensor's or transducer's sensitivity by performing two capacitance measurements at two distinct electrical input signals applied to the sensor or transducer. Thereby the two electrical input signals may be electrical signals defining a point of operation of the sensor or transducer, such a (bias-) voltages, electrical currents and/or electrical charges. In particular, the electrical input signals may be DC-signals according to some embodiments. Based on a difference of the two capacitance measurements, the sensitivity of the sensor or transducer may be determined as there is a functional relationship between the sensitivity and the determined capacitance difference. Embodiments may be used for measurements performed on wafers during production, for measurements formed under laboratory conditions as well as for measurements in integrated circuits, for example, for calibrating during startup.

The description and drawings merely illustrate the principles of embodiments. It will thus be appreciated that those skilled in the art will be able to devise various arrangements that, although not explicitly described or shown herein, embody the principles of embodiments and are included within its spirit and scope. Furthermore, all examples recited herein are principally intended expressly to be only for pedagogical purposes to aid the reader in understanding the principles of embodiments and the concepts contributed by the inventor(s) to furthering the art, and are to be construed as being without limitation to such specifically recited examples and conditions. Moreover, all statements herein reciting principles, aspects, and embodiments, as well as specific examples thereof, are intended to encompass equivalents thereof.

Functional blocks configured to perform a certain function shall be understood as functional blocks comprising dedicated circuitry that is adapted or programmed for performing a certain function, respectively. A block or circuit being adapted for performing a certain function does, hence, not imply that such means necessarily is performing the function (at a given time instant). Functions of various elements shown in the figures, including any functional blocks may be provided through the use of dedicated hardware as well as hardware capable of executing software in association with appropriate software. Moreover, any entity described herein as "means", may correspond to or be implemented as "one or more modules", "one or more devices", "one or more units", etc. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

It should be appreciated by those skilled in the art that any block diagrams herein represent conceptual views of illustrative circuitry embodying the principles of embodiments. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective steps of these methods.

Further, it is to be understood that the disclosure of multiple steps or functions disclosed in the specification or claims may not be construed as to be within the specific order. Therefore, the disclosure of multiple steps or functions will not limit these to a particular order unless such steps or functions are not interchangeable for technical reasons. Furthermore, in some embodiments a single step may include or may be broken into multiple sub steps. Such sub steps may be included and part of the disclosure of this single step unless explicitly excluded.

The invention claimed is:

1. An apparatus for determining a sensitivity of a capacitive sensing device having a sensor capacitor with a variable capacitance, the apparatus comprising:
   a measurement module configured to determine, in response to a first electrical input signal to the sensor capacitor, a first quantity indicative of a first capacitance of the sensor capacitor and to determine, in response to a second electrical input signal to the sensor capacitor, a second quantity indicative of a second capacitance of the sensor capacitor; and
   a processor configured to determine the sensitivity of the sensing device based on the determined first and second quantity.

2. The apparatus according to claim 1, wherein the processor is configured to determine a difference between the first and the second capacitance based on the determined first and second quantity and to determine the sensitivity based on the capacitance difference.

3. The apparatus according to claim 1, wherein the processor is configured to determine, based on the first and the second quantity or a difference thereof, the sensitivity using a functional relationship between the sensitivity and a difference between the first and the second sensor capacitance.

4. The apparatus according to claim 3, wherein the functional relationship is a polynomial constructed from the difference between the first and the second sensor capacitance.

5. The apparatus according to claim 1, wherein the measurement module comprises an LCR meter configured to determine, in response to the first electrical input signal, a first impedance of the sensor capacitor and to determine, in response to the second electrical input signal, a second impedance indicative of a second capacitance of the sensor capacitor, and to determine the first and the second sensor capacitance based on the first and second impedance.

6. The apparatus according to claim 1, wherein the measurement module is configured to determine the first quantity based on a first bias voltage applied to the sensor capacitor and to determine the second quantity based on a second, different, bias voltage applied to the sensor capacitor.

7. The apparatus according to claim 6, wherein the measurement module is configured to choose both the first and the second bias voltage to be smaller than a pull-in voltage of the capacitive sensing device, wherein the pull-in voltage denotes a bias voltage at which the sensor capacitor collapses.

8. The apparatus according to claim 6, wherein the measurement module is configured to choose the first and the second bias voltage such that a difference between the first and the second bias voltage is at least 0.5 V.

9. The apparatus according to claim 1, wherein the measurement module comprises an amplifier having an input terminal and an output terminal, wherein an output terminal of the sensor capacitor is coupled to the amplifier's input terminal and wherein a feedback capacitor is coupled between the amplifier's output and input terminal.

10. The apparatus according to claim 9, wherein the amplifier is an inverting amplifier, wherein the amplifier's input terminal is an inverting input terminal, and wherein a non-inverting input terminal of the amplifier is coupled to electrical ground.

11. The apparatus according to claim 9, wherein the measurement module is configured to apply a first bias voltage to an input port of the sensor capacitor and to measure a resulting first output voltage at the amplifier's output terminal, and to subsequently apply a second bias voltage to the input port of the sensor capacitor and to measure a resulting second output voltage at the amplifier's output terminal, and to determine a sensor capacitance difference based on the first and the second bias voltage and the first and the second output voltage.

12. The apparatus according to claim 11, wherein the measurement module or the processor is configured to determine sensor capacitance difference $\Delta C$ based on $$\Delta C = Cf^*(Vout1/Vb1 - Vout2/Vb2),$$

wherein Cf denotes a capacitance of the feedback capacitor, Vout1 denotes the first output voltage, Vb1 denotes the first bias voltage, Vout2 denotes the second output voltage, and Vb2 denotes the second bias voltage.

13. The apparatus according to claim 1, wherein the measurement module is configured to determine the first quantity based on a first electrical charge applied to the sensor capacitor and to determine the second quantity based on a second, different, electrical charge applied to the sensor capacitor.

14. The apparatus according to claim 13, wherein the measurement module comprises a switched capacitor network to apply the first and the second electrical charge to the sensor capacitor, respectively.

15. The apparatus according to claim 14, wherein the measurement module comprises an amplifier having an input terminal and an output terminal, wherein the sensor capacitor is coupled between the output terminal and the input terminal of the amplifier, wherein the first electrical charge is transported from a voltage source via a transport capacitor to the sensor capacitor in a first clock cycle of the switched capacitor network, leading to a first output voltage at the output terminal of the amplifier, wherein the second electrical charge is transported from the voltage source via the transport capacitor to the sensor capacitor in a second clock cycle of the switched capacitor network, leading to a second output voltage at the output terminal of the amplifier, and wherein the measurement module is configured to determine a sensor capacitance difference based on a voltage of the voltage source and the first and the second output voltage.

16. The apparatus according to claim 15, wherein the measurement module or the processor is configured to determine the sensor capacitance difference $\Delta C$ based on $$\Delta C = Cq^*(2Vq/Vout2 - Vq/Vout1),$$

wherein Cq denotes a capacity of the transport capacitor, Vq denotes the voltage of the voltage source, Vout1 denotes the first output voltage, and Vout2 denotes the second output voltage.

17. The apparatus according to claim 13, wherein the measurement module comprises a current source coupled to the sensor capacitor via a switch.

18. The apparatus according to claim 17, wherein the measurement module is configured to charge, during a first time interval, the sensor capacitor with a constant current from the current source to obtain a first voltage across electrodes of the sensor capacitor, and to further charge, during a subsequent second time interval, the sensor capacitor with the constant current to obtain a second voltage across the electrodes of the sensor capacitor, and wherein the measurement module is configured to determine a sensor capacitance difference based on a duration of the time intervals, the constant current and the first and the second voltage.

19. The apparatus according to claim 18, wherein the measurement module or the processor is configured to determine the sensor capacitance difference $\Delta C$ based on $$\Delta C = T^*Iconst^*(2/Vout2 - 1/Vout1),$$

wherein T denotes a duration of the first and the second time interval, Iconst denotes the constant current, Vout1 denotes the first voltage, and Vout2 denotes the second voltage across the electrodes of the sensor capacitor.

20. The apparatus according to claim 1, wherein the sensor capacitor is formed by a diaphragm and a back plate of the capacitive sensing device.

21. The apparatus according to claim 1, wherein the capacitive sensing device is a condenser microphone or a pressure sensor.

22. An apparatus for determining a sensitivity of a capacitive sensing device having a sensor capacitor with a variable capacitance, wherein the sensor capacitor is formed by a diaphragm and a back plate, the apparatus comprising:
 a measurement circuit which is configured to determine, in response to a first bias voltage applied to the sensor capacitor, a first quantity indicative of a first sensor capacitance between the diaphragm and the back plate, and to determine, in response to a second bias voltage applied to the sensor capacitor, a second quantity indicative of a second sensor capacitance between the diaphragm and the back plate; and
 a processor configured to determine the sensitivity of the sensing device based on a difference between the first and the second sensor capacitance.

23. A method for determining a sensitivity of a capacitive sensing device having a sensor capacitor with a variable capacitance, the method comprising:
 determining, in response to a first electrical input signal to the sensor capacitor, a first measurement quantity indicative of a first capacitance of the sensor capacitor;
 determining, in response to a second electrical input signal to the sensor capacitor, a second measurement quantity indicative of a second capacitance of the sensor capacitor; and
 determining the sensitivity of the sensing device based on the determined first and second measurement quantity.

24. The method according to claim 23, wherein the first electrical input signal depends on a first bias voltage applied to the sensor capacitor and wherein the second electrical input signal depends on a second bias voltage applied to the sensor capacitor.

* * * * *